United States Patent
Bliss et al.

(10) Patent No.: US 6,216,249 B1
(45) Date of Patent: Apr. 10, 2001

(54) SIMPLIFIED BRANCH METRIC FOR REDUCING THE COST OF A TRELLIS SEQUENCE DETECTOR IN A SAMPLED AMPLITUDE READ CHANNEL

(75) Inventors: William G. Bliss, Thornton; Sian She, Broomfield, both of CO (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/261,417

(22) Filed: Mar. 3, 1999

(51) Int. Cl.$^7$ .................................................. G06F 11/10
(52) U.S. Cl. .................................... 714/792; 714/796
(58) Field of Search ............................... 714/792, 796; 375/265

(56) References Cited

U.S. PATENT DOCUMENTS

| | | | |
|---|---|---|---|
| 5,291,499 | 3/1994 | Behrens et al. | 371/43 |
| 5,412,669 | 5/1995 | Foland, Jr. | 371/43 |
| 5,835,510 | 11/1998 | Hayashi | 371/43.7 |
| 5,844,947 | 12/1998 | Cesari | 375/341 |
| 5,926,490 * | 7/1999 | Reed et al. | 371/44 |
| 5,940,416 | 8/1999 | Nishiya et al. | 371/43.7 |
| 6,032,284 * | 2/2000 | Bliss | 714/792 |
| 6,115,198 * | 9/2000 | Reed et al. | 360/46 |

\* cited by examiner

*Primary Examiner*—Phung M. Chung
(74) *Attorney, Agent, or Firm*—Howard H. Sheerin; Dan A. Shifrin

(57) ABSTRACT

A sampled amplitude read channel for use in disk storage systems (magnetic or optical) is disclosed comprising a simplified branch metric calculator for use in a trellis sequence detector. Instead of computing the traditional Euclidean branch metric as the squared difference between the actual signal sample and the expected signal sample of the target partial response, the present invention computes a simplified branch metric which is then saturated in order to reduce the number of bits required to calculate and store the branch metrics, thereby simplifying the branch metric calculators as well as reducing the add-compare-select (ACS) circuitry for each state in the trellis. Furthermore, the saturation technique of the present invention is substantially data independent meaning that the saturation threshold is essentially independent from the signal samples used to compute the branch metric.

14 Claims, 6 Drawing Sheets

SIMPLIFIED BRANCH METRIC FOR REDUCING THE COST OF A TRELLIS SEQUENCE DETECTOR IN A SAMPLED AMPLITUDE READ CHANNEL

FIELD OF INVENTION

The present invention relates to the recording and reproduction of binary data in disk storage systems (magnetic and optical) for digital computers, particularly to a disk storage system employing a simplified branch metric calculator for reducing the cost of a trellis sequence detector by reducing the number of bits needed to calculate and store the branch metrics, which in turn reduces the add-compare-select circuitry for each state in the trellis.

CROSS REFERENCE TO RELATED APPLICATIONS AND PATENTS

This application is related to several U.S. patents, namely U.S. Pat. No. 5,291,499 entitled "METHOD AND APPARATUS FOR REDUCED-COMPLEXITY VITERBI-TYPE SEQUENCE DETECTORS," U.S. Pat. No. 5,696,639 entitled "SAMPLED AMPLITUDE READ CHANNEL EMPLOYING INTERPOLATED TIMING RECOVERY," and U.S. Pat. No. 5,424,881 entitled "SYNCHRONOUS READ CHANNEL." All of the above-named patents are assigned to the same entity, and all are incorporated herein by reference.

BACKGROUND OF THE INVENTION

Computer systems typically comprise a disk storage device, for example a magnetic or optical disk drive, which provide an inexpensive means to store large amounts of digital data in a non-volatile manner. The disk storage device is essentially a communication system where the storage medium (magnetic or optical), transducer, and read/write electronics constitute the communication channel. Similar to other communication channels, the digital data in storage devices is "transmitted" through the channel by modulating an analog signal. In magnetic disk storage systems, for example, the digital data modulates the current in an inductive write coil in order to write a sequence of magnetic transitions onto the surface of a magnetic disk in concentric, radially spaced tracks. And in optical disk storage systems, the digital data may modulate the intensity of a laser beam in order to write a series of "pits" onto the surface of an optical disk in tracks that spiral inward toward the center of the disk.

During a read operation, a transducer or read head is positioned in close proximity to the surface of the disk, and while the disk spins under the read head, the read head senses the alterations (magnetic or optical) representing the digital data. The read head generates an analog read signal comprising pulses induced by the surface alterations. In magnetic recording, for example, the read head comprises a sensor that is responsive to the changes in the magnetic flux caused by the magnetic transitions representing the digital data. And in optical disk storage systems, the read head comprises a photodetector for measuring the intensity of a laser beam reflecting off the surface of the disk which changes as it passes over the pits representing the digital data.

As with other bandlimited communication channels, the maximum capacity of a disk storage system is approximated by Shannon's equation for the capacity of an additive white Gaussian noise channel:

$$C = W \log\left(1 + \frac{P}{N_0 W}\right).$$

In the above equation, W is the channel bandwidth, $N_0$ is the noise power spectrum, and P is the signal power. The bandwidth W of a disk storage system is, for the most part, limited by the characteristics of the storage medium. Thus, once the storage medium is chosen, the maximum capacity of the storage system is essentially a function of the signal power P and the noise power $N_0$ (i.e., the signal-to-noise ratio or SNR). Certain characteristics of the storage medium also contribute to the noise power in the read signal, so designers generally choose the least expensive medium that will provide the highest bandwidth and SNR to attain maximum storage capacity.

In addition to innovations in the storage medium itself, attempts to increase storage capacity generally focus on improving the actual SNR through improvements to the transducer and drive electronics, as well as improving the effective SNR through the use of error correction codes (ECC), such as the Reed-Solomon ECC codes, and through the use of sophisticated signal processing techniques spawned by communication theory.

One such advancement in communication theory recently applied to disk storage systems that has provided significant gains in storage capacity is partial response (PR) signaling with maximum likelihood (ML) sequence detection. Partial response signaling refers to a particular method for transmitting symbols represented as analog pulses through a communication medium. The benefit is that at the signaling instances (baud rate) there is no intersymbol interference (ISI) from other pulses except for a controlled amount from immediately adjacent, overlapping pulses. Allowing the pulses to overlap in a controlled manner leads to an increase in the symbol rate (linear recording density) without sacrificing performance in terms of SNR. Stated differently, a partial response signal provides an increase in the effective SNR by making more efficient use of the channel bandwidth.

Partial response channels are characterized by the polynomials $$(1-D)(1+D)^n$$

where D represents a delay of one symbol period and n is an integer. For n=1,2,3, the partial response channels are referred to as PR4, EPR4 and EEPR4, with their respective frequency responses shown in FIG. 1A. The channel's dipulse response, the response to an isolated symbol, characterizes the transfer function of the system (the output for a given input). With a binary "1" bit modulating a positive dipulse response and a binary "0" bit modulating a negative dipulse response, the output of the channel y(t) is a linear combination of time shifted dipulse responses $$y(t) = \Sigma a_n p(t-nT)$$

where an denotes the write current symbols +1 and −1 at time n and p(t) represents the channel's dipulse response shifted by nT (n symbol periods). The dipulse response for a PR4 channel $(1-D^2)$ is shown as a solid line in FIG. 1B. Notice that at the symbol instances (baud rate), the dipulse response is zero except at times t=0 and t=2. Thus, the linear combination of time shifted PR4 dipulse responses will result in zero ISI at the symbol instances except where immediately adjacent pulses overlap.

It should be apparent that the linear combination of time shifted PR4 dipulse responses will result in a channel output of +2, 0, or −2 at the symbol instances (with the dipulse samples normalized to +1, 0, −1) depending on the binary input sequence. The output of the channel can therefore be characterized as a state machine driven by the binary input sequence, and conversely, the input sequence can be estimated or demodulated by running the signal samples at the output of the channel through an "inverse" state machine. Because noise will obfuscate the signal samples, the inverse state machine is actually implemented as a trellis sequence detector which computes a most likely input sequence associated with the signal samples. The algorithm for selecting a most likely sequence through a trellis was invented by a man named Viterbi, and thus the algorithm is commonly referred to as the Viterbi algorithm.

The Viterbi algorithm for a PR4 trellis sequence detector is understood from its state transition diagram shown in FIG. 2A. Each state 2 is represented by the last two input symbols (in NRZ after preceding), and each branch from one state to another is labeled with the current input symbol in NRZ 4 and the corresponding sample value 6 it will produce during readback. The demodulation process of the PR4 sequence detector is understood by representing the state transition diagram of FIG. 2A as a trellis diagram shown in FIG. 2B. The trellis diagram represents a time sequence of sample values and the possible recorded input sequences that could have produced the sample sequence. For each possible input sequence, an error metric is computed relative to a difference between the sequence of expected sample values that would have been generated in a noiseless system and the actual sample values output by the channel. For instance, a Euclidean metric is computed as the accumulated square difference between the expected and actual sample values. The input sequence that generates the smallest Euclidean metric is the most likely sequence to have generated the actual sample values; this sequence is therefore selected as the output of the sequence detector.

To facilitate the demodulation process, the sequence detector comprises path memories for storing each of the possible input sequences and a corresponding branch metric. A well known property of the sequence detector is that the paths storing the possible input sequences will "merge" into a most likely input sequence after a certain number of sample values are processed, as long as the input sequence is appropriately constrained. In fact, the maximum number of path memories needed equals the number of states in the trellis diagram; the most likely input sequence will always be represented by one of these paths, and these paths will eventually merge into one path (i.e., the most likely input sequence) after a certain number of sample values are processed.

The "merging" of path memories is understood from the trellis diagram of FIG. 2B where the "survivor" sequences are represented as solid lines. Notice that each state in the trellis diagram can be reached from one of two states; that is, there are two transition branches leading to each state. With each new sample value, the Viterbi algorithm recursively computes a new error metric and retains a single survivor sequence for each state corresponding to the minimum error metric. In other words, the Viterbi algorithm will select one of the two input branches into each state since only one of the branches will correspond to the minimum error metric, and the paths through the trellis corresponding to the branches not selected will merge into the paths that were selected. Eventually, all of the survivor sequences will merge into one path through the trellis which represents the most likely estimated data sequence to have generated the sample values as shown in FIG. 2B.

In addition to achieving maximum storage capacity, designers of disk storage systems are generally concerned with minimizing the cost, latency and power dissipation of the digital circuits which implement the signal processing algorithms. Power dissipation is of particular concern in portable applications where battery life is an important performance consideration; the more efficient the read channel circuitry, the less power it will dissipate. Latency, which is related to power dissipation, is also of particular concern as the demand for higher throughput read channels increases perpetually.

The trellis sequence detector is one of the more compute intense components of a partial response read channel, particularly the branch metric circuitry for squaring the difference between the actual signal samples and the expected samples of the target partial response, as well as the circuitry for adding-comparing-selecting (ACS) the appropriate branch metrics for each state. As described above, an error metric is computed for the two branches entering each state in the trellis; the error metric is added to the previously accumulated branch metric, compared to the contending branch metric, and the smaller of the branch metrics selected to extend the survivor sequence. Since the number of states increases exponentially with increasing partial response order (PR4, EPR4, EEPR4, etc.), so does the cost and power dissipation of the branch metric calculators and ACS circuitry. Furthermore, the latency in computing the branch metrics and performing the add-compare-select operations can adversely impact the maximum throughput of the read channel.

There is, therefore, a need for an improved sampled amplitude read channel for use in disk storage systems that employees more efficient circuitry for implementing the maximum likelihood sequence detection algorithm, such as the Viterbi algorithm. In particular, is an object of the present invention to provide more efficient branch metric calculators and ACS circuits in a trellis sequence detector in order to minimize cost and power dissipation, as well as to increase the throughput of the read channel.

SUMMARY OF THE INVENTION

A sampled amplitude read channel for use in disk storage systems (magnetic or optical) is disclosed comprising a simplified branch metric calculator for use in a trellis sequence detector. Instead of computing the traditional Euclidean branch metric as the squared difference between the actual signal sample and the expected signal sample of the target partial response, the present invention computes a simplified branch metric which is then saturated in order to reduce the number of bits required to calculate and store the branch metrics, thereby simplifying the branch metric calculators as well as reducing the add-compare-select (ACS) circuitry for each state in the trellis. Furthermore, the saturation technique of the present invention is substantially data independent meaning that the saturation threshold is essentially independent from the signal samples used to compute the branch metric.

BRIEF DESCRIPTION OF THE DRAWINGS

The above and other aspects and advantages of the present invention will be better understood by reading the following detailed description of the invention in conjunction with the drawings, wherein.

DETAILED DESCRIPTION OF THE PREFERRED EMBODIMENT

Overview

Figure 3:
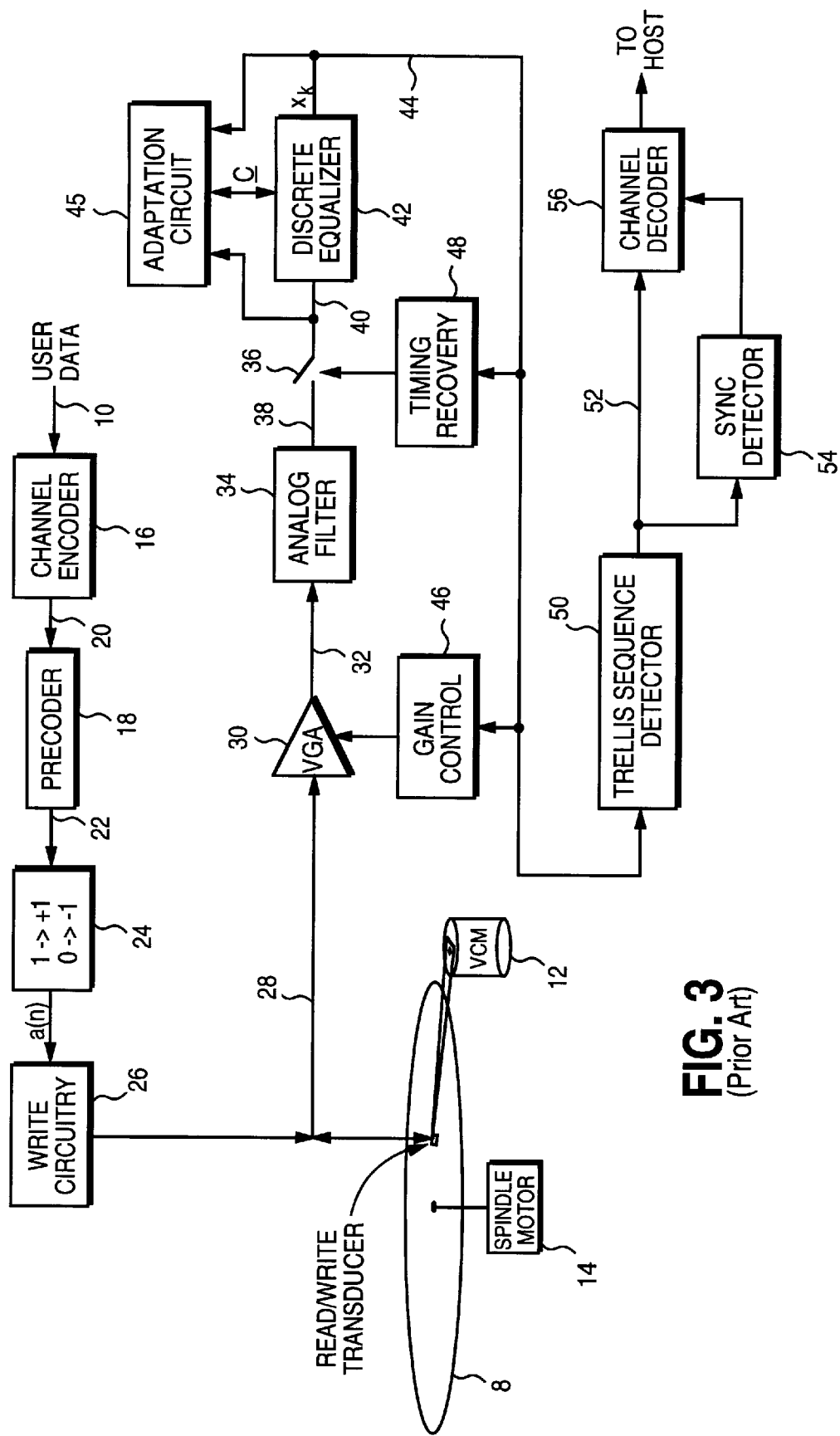
FIG. 3 is a block diagram of a conventional sampled amplitude comprising timing recovery, gain control, equalization, and a trellis sequence detector.

The sampled amplitude read channel of the present invention is intended to operate within a magnetic or optical disk storage device as illustrated in FIG. 3. A voice coil motor (VCM) 12 positions a read/write transducer over a desired data track of a disk storage medium 8 during read and write operations, and a spindle motor 14 rotates the disk 8 at a very high velocity. During a write operation, user data 10 received from a host system is encoded by a channel encoder 16. The channel encoder 16 encodes the user data 10 according to a predetermined channel code constraint, for example, according to a run-length-limited (RLL) constraint. After encoding the channel code constraints, a precoder 18 filters the encoded data 20 to compensate for the transfer function of the recording channel to facilitate implementation of the channel encoder 16. In a PR4 read channel, for example, the precoder 18 is typically of the form $1/(1+D^2)$ which is the inverse of the PR4 transfer function $(1-D^2)$. The precoded data 22 is converted 24 into symbols a(n) by converting a binary "1" bit to +1, and a binary "0" bit to −1. The symbols a(n) modulate operation of the write circuitry 26 which records the digital data onto the surface of the disk 8 through the write transducer.

Figure 1A:
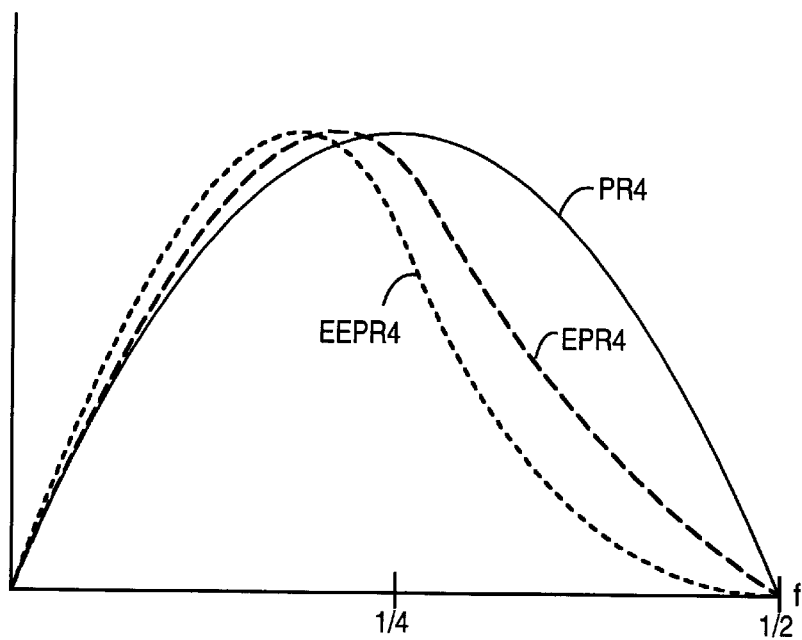
FIG. 1A shows the frequency response for a PR4, EPR4 and EEPR4 read channel.
Figure 1B:
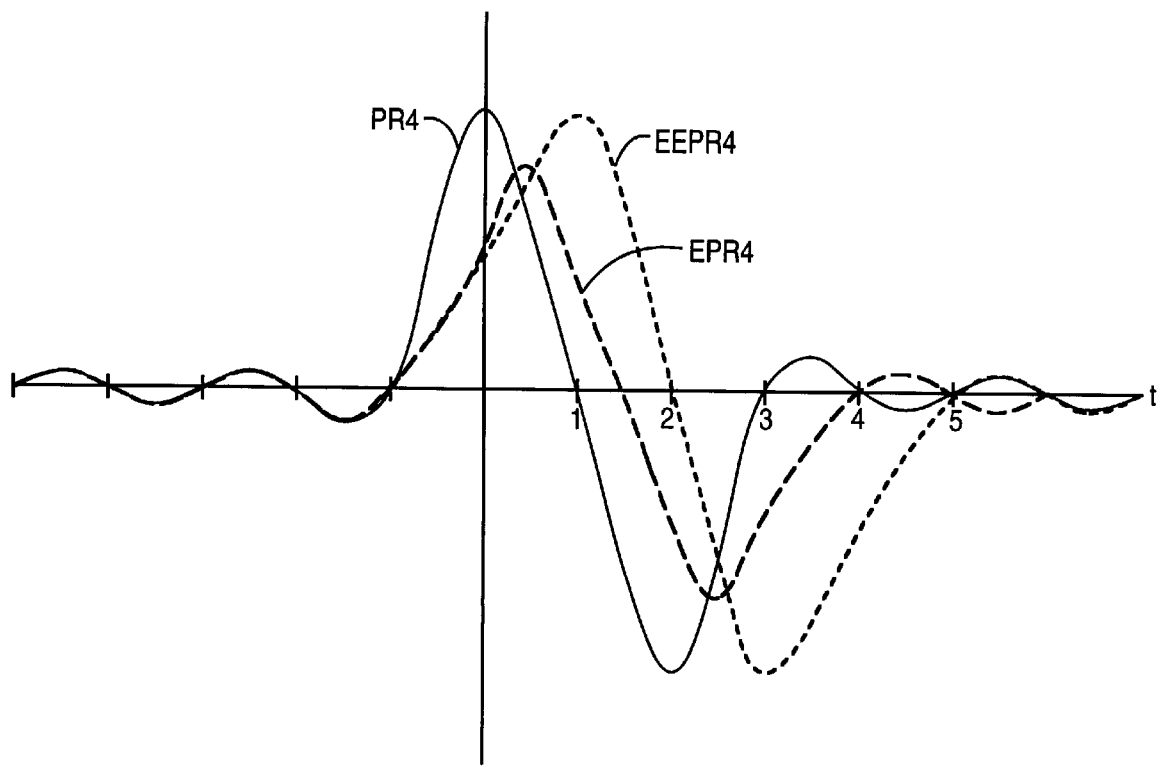
FIG. 1B shows the dipulse responses for the PR4, EPR4 and EEPR4 read channels of FIG. 1A.

To read the recorded data, the read/write transducer is again positioned over the track by the VCM motor 12, and as the disk 8 rotates, the read transducer senses the surface alterations recorded on the disk 8. The read signal 28 emanating from the read head is amplified by a variable gain amplifier (VGA) 30, and the amplified read signal 32 is filtered by an analog filter 34 which attenuates aliasing noise and provides initial equalization of the read signal toward the target partial response. A sampling device 36 samples the analog read signal 38 at the output of the analog filter 34 to generate discrete-time samples 40 of the read signal. The discrete-time samples 40 are equalized by a discrete-time equalizer 42 to generate equalized sample values $x_k$ 44 which ideally match the target partial response. Example target partial responses include the PR4, EPR4 and EEPR4 responses shown in FIG. 1A with respective dipulse responses shown in FIG. 1B and further illustrated in Table 1:

TABLE 1

| Channel | Transfer Function | Dipulse Response |
| --- | --- | --- |
| PR4 | $(1-D)(1+D)$ | 0, 1, 0, −1, 0, 0, 0, ... |
| EPR4 | $(1-D)(1+D)^2$ | 0, 1, 1, −1, −1, 0, 0, ... |
| EEPR4 | $(1-D)(1+D)^3$ | 0, 1, 2, 0, −2, −1, 0, ... |

Many conventional sampled amplitude read channels also employ an adaptation circuit 45 for adapting the discrete-time equalizer 42 to compensate in real-time for various system dynamics, such as the sector location of the read head, variations in fly-height, and other parameter variations caused by temperature drift or voltage fluctuations. The adaptation circuit 45 implements a coefficient update algorithm, such as a least mean square (LMS) algorithm, to compute optimal coefficients C in real time for use in the filtering operation of the discrete-time equalizer 42 as a data sector is being read from the disk.

The sampling device 36 may be implemented as a simple sample and hold circuit, and the downstream components, such as the discrete-time equalizer 42, could be implemented using discrete-time analog (DTA) circuitry. Alternatively, the samples 40 of the read signal could be converted into digital values and the downstream components implemented using digital circuitry. In still another embodiment, the read channel could be implemented using a hybrid of DTA and digital circuits, for example, implementing the discrete-time equalizer 42 in DTA, converting the equalized samples $x_k$ 44 to digital values, and implementing the trellis sequence detector 50 in in digital circuitry.

The equalized samples $x_k$ 44 are processed by a gain control 46 and a timing recovery circuit 48 which adjust the amplitude of the analog read signal 28 and frequency/phase of the sampling device 24, respectively. These circuits are decision-directed feedback loops which attempt to minimize an error between the actual signal samples $x_k$ 44 and estimated or ideal samples of the target partial response. Typically, a simple slicer circuit (not shown) generates the estimated sample values of a PR4 partial response. The timing recovery circuit 48 adjusts the frequency/phase of the sampling device 36 in order to synchronize the sampling of the analog read signal 38 to the baud rate. Alternatively, the analog read signal 38 could be sampled 36 a synchronously and the asynchronous sample values 40 interpolated to generate baud rate synchronous sample values (see the above referenced U.S. Pat. No. 5,696,639 incorporated by reference).

After equalizing the read signal according to the desired partial response and synchronizing to the baud rate, the read signal samples $x_k$ 44 are demodulated by a trellis sequence detector 50 which computes an estimated binary sequence 52 most likely to have generated the read signal samples $x_k$ 44. A sync mark detector 54 processes the estimated binary sequence 52 to detect a sync mark in the data which demarks the beginning of the data field in the sector. When the sync mark is detected, a channel decoder 56 is enabled which then decodes the estimated binary sequence 52 into an estimate of the originally recorded user data, where the channel decoder 56 performs the inverse operation of the channel encoder 16.

The decoded estimate of the user data is then transferred to the host, typically after correcting errors using an error correction code (ECC).

Trellis Sequence Detector

Figure 2A:
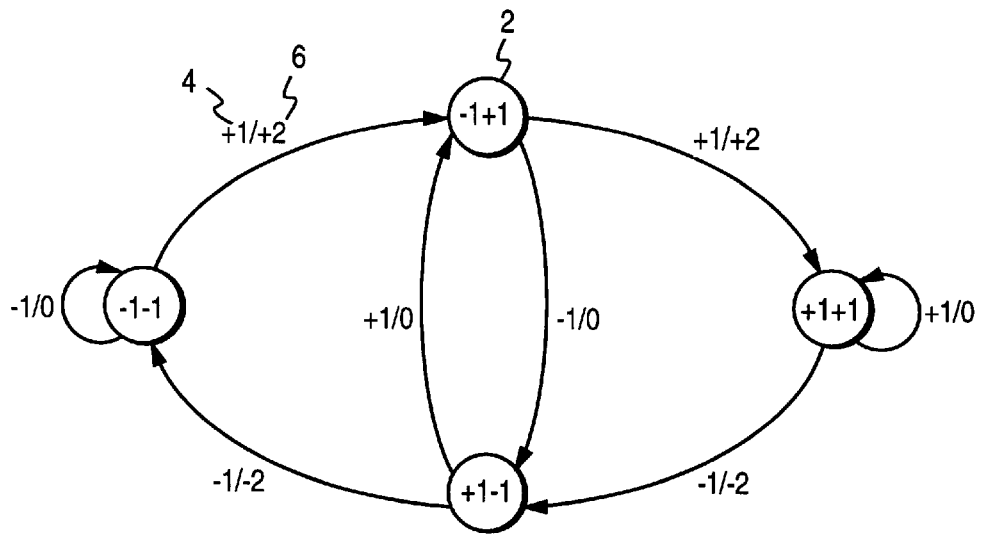
FIG. 2A is a state transition diagram for a PR4 sequence detector.
Figure 4:
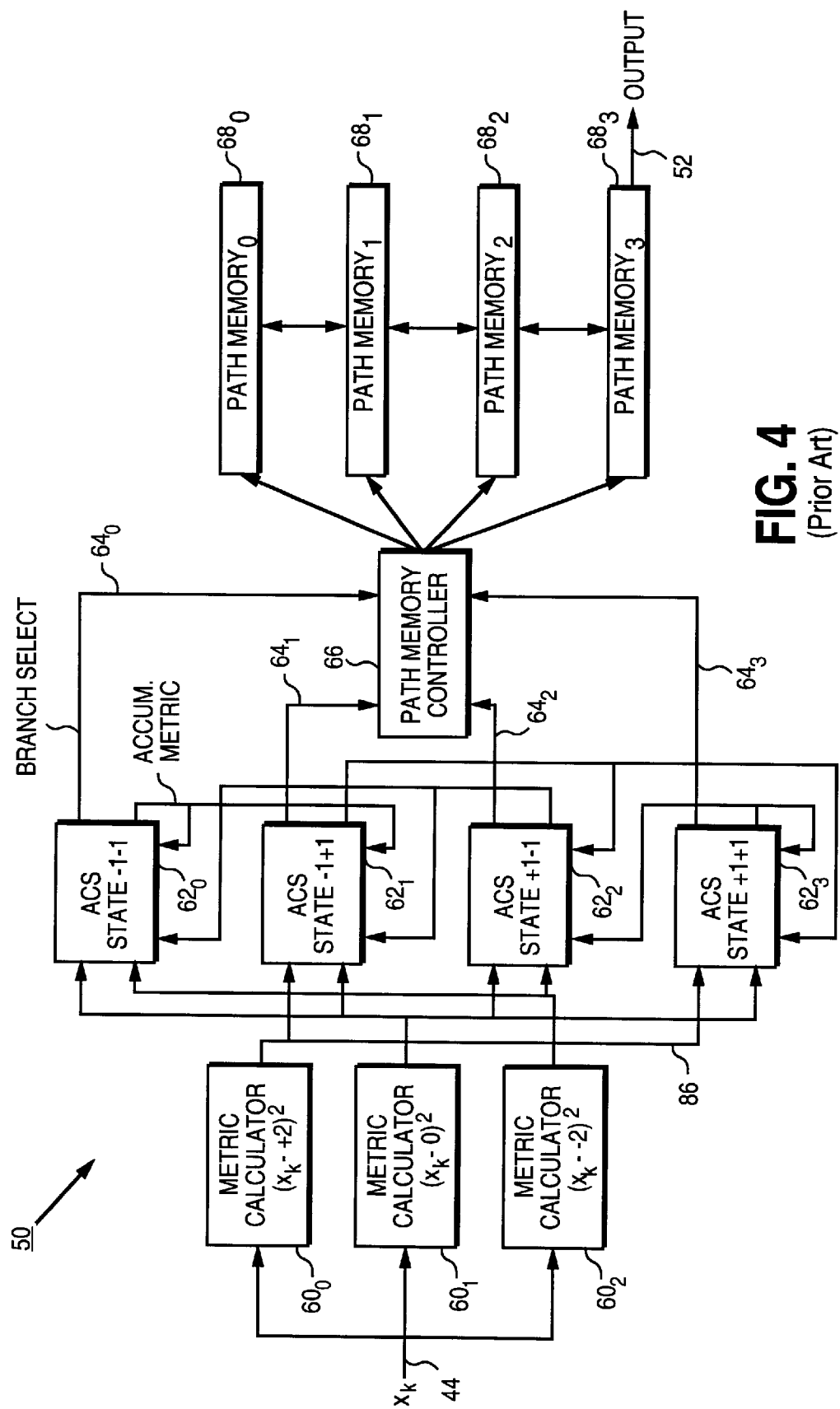
FIG. 4 shows further details of an example PR4 trellis sequence detector comprising metrics calculators, add-compare-select (ACS) circuits, a path memory controller, and path memories for storing the survivor sequences.

FIG. 4 shows details of an example trellis sequence detector 50 implementing the Viterbi algorithm for a PR4 read channel. As described above with reference to FIG. 2A, a PR4 state machine comprises four states and the ideal PR4 sample take on values of +2, 0 or −2. Therefore, the PR4 sequence detector shown in FIG. 4 comprises three branch metric calculators $60_0$–$60_2$ corresponding to the ideal partial response sample values +2, 0 and −2, and four add-compare-select (ACS) circuits $62_0$–$62_3$ corresponding to the four states (−1−1), (−1+1), (+1−1) and (+1+1) in the PR4 trellis of FIG. 2B. The branch metric calculators $60_0$–$60_2$ compute a Euclidean error metric by squaring the difference between the actual signal samples $x_k$ 44 and the ideal partial response values. At each sample interval, a branch metric is computed for the three ideal PR4 samples and transferred to the appropriate ACS circuits $62_0$–$62_3$ as illustrated in FIG. 4. The ACS circuits $62_0$–$62_3$ add the new branch metric to the previously accumulated branch metric for each of the two branches entering each state (see FIG. 2A and 2B). The two accumulated branch metrics are then compared, and the smaller accumulated branch metric is selected as the surviving branch metric for that state.

Figure 2B:
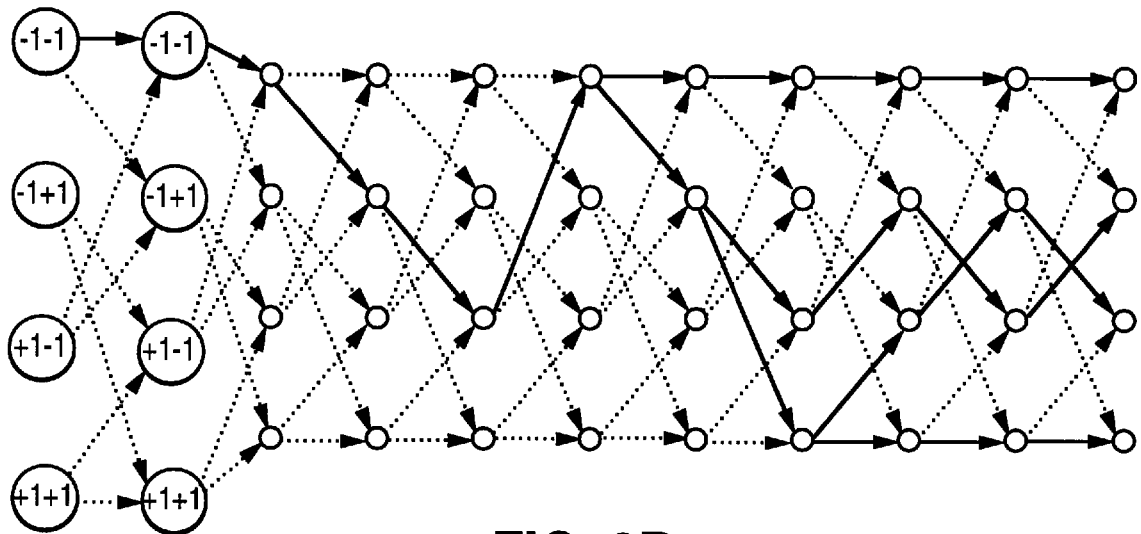
FIG. 2B is a trellis diagram corresponding to the PR4 state transition diagram of FIG. 2A showing the path memory and survivor sequence for a given input sequence.

The ACS circuits $62_0$–$62_3$ provide a branch select control signal $64_0$–$64_3$ to a path memory controller 66 indicating which branch was selected. In response to the branch select control signals $64_0$–$64_3$, the path memory controller 66 shifts into the path memories $68_0$–$68_3$ for each state the appropriate binary symbol corresponding to the branch selected. The path memory controller 66 also merges the survivor sequences stored in the path memories $68_0$–$68_3$ based on the branches that were not selected. Eventually, all of the path memories will merge into one survivor sequence as illustrated in FIG. 2B (as long as the input sequence is appropriately constrained) such that the path memories will all contain the same sequence near their outputs. Thus, the output 52 of the trellis sequence detector 50 can be taken from the output of any one of the path memories; in FIG. 4, the output is taken from the output of the last path memory $68_3$.

The trellis sequence detector shown in FIG. 4 is not the preferred implementation for a PR4 read channel. Typically, a PR4 sequence detector is implemented as two sliding threshold detectors which operate independently on the even and odd interleaves (or dicodes) of the data sequence. A sliding threshold detector is significantly less complex to implement; it requires only a simple comparator for comparing the read signal samples to a sliding threshold as compared to the more complex branch metric calculators and ACS circuits of FIG. 4. However, high order read channels (EPR4, EEPR4, etc.) cannot be factored similar to a PR4 read channel, and therefore typically require the more complex branch metric calculators and ACS circuits. The above referenced U.S. Pat. No. 5,291,499 discloses a method for reducing the number of ACS circuits and attendant path memories through a technique referred to as "state sharing" which exploits symmetry in the state transition diagram. However, even with this reduced cost implementation, it is desirable to implement the branch metric calculators and ACS circuitry as efficient as possible in order to further minimize the cost and power dissipation, as well as increase the throughput of the read channel.

One way to decrease the cost of the trellis sequence detector is to saturate the branch metrics in order to reduce the number of bits used to represent the metrics, as well as the number of bits to perform the add-compare-select functions in the ACS circuitry. The reason saturation does not significantly degrade performance of the trellis detector is because once an accumulated metric exceeds some large threshold, the likelihood that its survivor sequence will be selected by the ACS circuitry becomes very small. Thus, the most significant bits required to represent a large branch metric can be ignored, or dropped, without significantly impacting the performance of the read channel.

Another way to simplify the implementation of the trellis sequence detector by reducing the number of bits needed to represent the branch metric is to drop the $x_k^2$ term from the branch metric calculation. The traditional Euclidean branch metric is calculated according to $$b = (x_k - An_i)^2 = x_k^2 - 2x_k An_i + (An_i)^2 \qquad (1)$$

where $An_i$ represents the ideal partial response sample value for branch i, A is an even positive scaler, and n is an integer (e.g., for EPR4, n={−2,−1,0,+1,+2} and A=10). Comparing accumulated branch metrics can be represented mathematically as $$\Sigma x_k^2 - 2x_k An_i + (An_i)^2 < \Sigma x_k^2 - 2x_k An_j + (An_j)^2 \qquad (2)$$

where the ideal sample sequences $An_t$ on each side of the above equation represent the two possible output sequences corresponding to two survivor sequences through the trellis. Since the term $x_k^2$ appears on both sides of equation (2), it can be dropped from the comparison without affecting the result $$\Sigma - 2x_k An_i + (An_i)^2 < \Sigma - 2x_k An_j + (An_j)^2. \qquad (3)$$

Dividing both sides of equation (3) by 2A leads to the following simplified computation for the branch metric $$\tilde{b} = -x_k n + An^2/2 \qquad (4)$$

which requires less bits to represent and only one multiplier and one adder to implement. The problem with the above simplification, however, is that saturating equation (4) is not equivalent to saturating the traditional Euclidean metric of equation (1).

Saturating equation (1) can be represented as $$b = \begin{cases} x_k^2 - 2x_k An + (An)^2 & b < Th \\ Th & b \geq Th \end{cases} \qquad (5)$$

where Th is a predetermined saturation threshold. Similarly, saturating equation (4) can be represented as $$\tilde{b} = \begin{cases} -x_k n + An^2/2 & -Th < \tilde{b} < +Th \\ +Th & \tilde{b} \geq +Th \\ -Th & \tilde{b} \leq -Th \end{cases} \qquad (6)$$

Comparing equation (6) to equation (5) illustrates that the effective saturation level in equation (6) is dependent on the current read signal sample $x_k$. In effect, the simplified branch metric $\tilde{b}$ can be though of as having a data dependent offset of $(-x_k^2)$; consequently, branch metrics computed from read signal samples $x_k$ having a small absolute value (i.e., read signal samples near zero) are saturated much harder than branch metrics computed from read signal samples $x_k$ with large absolute values. Further, because the branch metrics $\tilde{b}$ generated from equation (4) can be negative (and frequently is), it is important not to saturate or alter the most negative branch lt metrics $\hat{b}$ since they can represent a "good" metric where the read signal sample $x_k$ is close to the target partial response sample $y_k$.

Simplified Branch Metric Calculator

The present invention overcomes the above problems associated with simplifying and saturating the branch metric; instead of dropping the $x_k^2$ term from the traditional Euclidean metric calculation as described above, the present invention effectively adds a small positive offset to the traditional Euclidean branch metric of equation (1) so that it is a multiple of 2A, and then divides the resulting branch metric by 2A to produce a simplified branch metric with a reduced number of bits. Further, the simplified branch metric can be saturated substantially independent of the read signal sample $x_k$ which means the branch metrics computed from the read signal samples near zero, as well as the traditional Euclidean branch metrics near zero, are not saturated as in the above implementation.

Adding an offset of $2A-rem(x_k^2,2A)$ (where rem(a,b) returns the remainder of a/b) to the traditional Euclidean branch metric of equation (1) results in a branch metric that is a multiple of 2A. This modified branch metric can be divided by 2A, and the resulting simplified branch metric saturated to reduce the number of bits needed to represent the branch metric, as well as the number of bits needed to perform to the add-compare-select functions of the ACS circuitry. Further, the resulting simplified branch metric can be saturated substantially independent of the read signal sample $x_k$.

Adding $2A-rem(x_k^2,2A)$ to the traditional branch metric of equation (1) and dividing by 2A to generate the simplified branch metric can be represented mathematically as $$\hat{b}=(b+2A-rem(x_k^2,2A))/(2A) \quad (7)$$

which is equivalent to $$\hat{b}=(x_k^2+2A-rem(x_k^2,2A))/(2A)+\tilde{b}. \quad (8)$$

Saturating the simplified branch metric $\hat{b}$ of equation (8) is still dependent on the read signal sample $x_k$, but only a small amount as compared to saturating the branch metric of equation (4). Further, the simplified branch metric $\hat{b}$ of equation (8) is always positive which means the corresponding Euclidean branch metrics near zero are not saturated as is the case when the simplified branch metric $\hat{b}$ of equation (4) is saturated.

Figure 5:
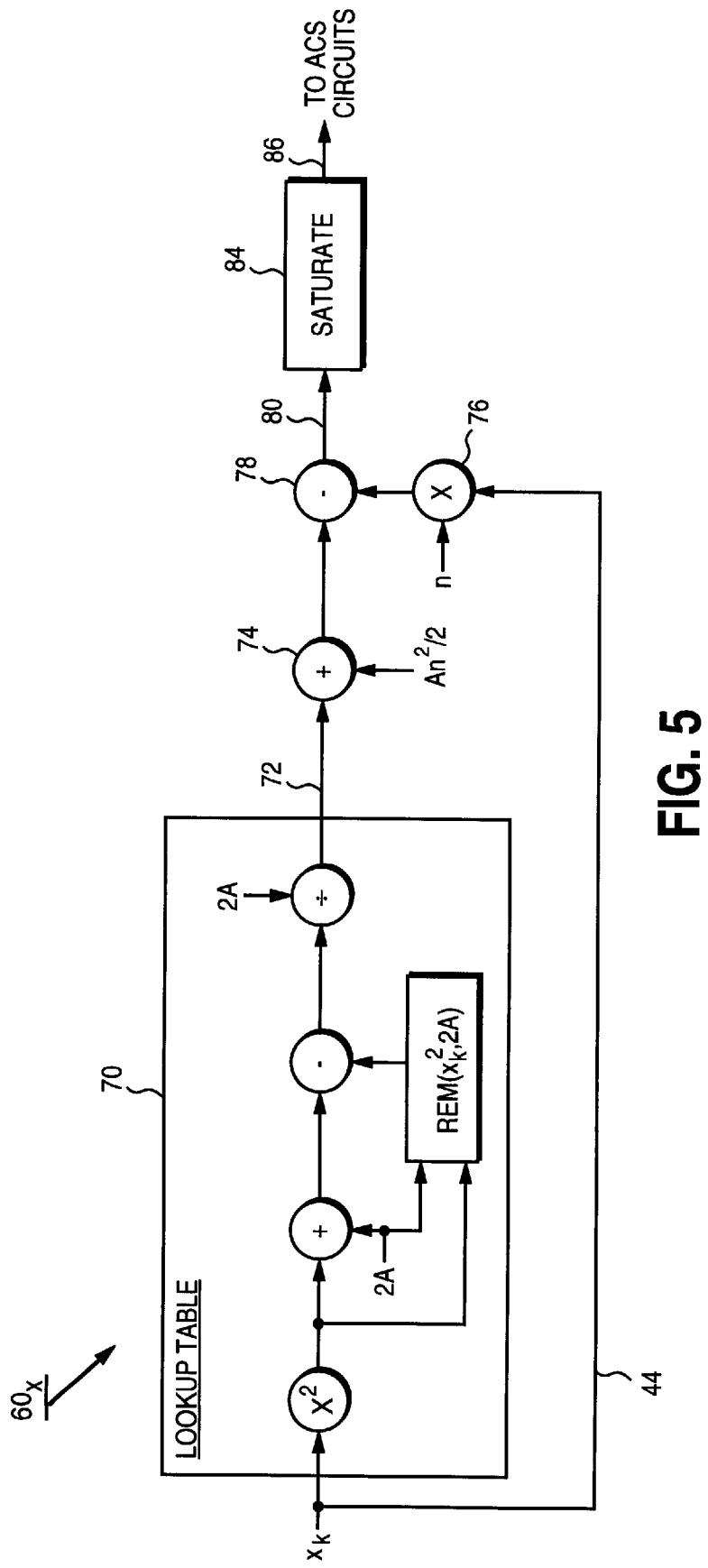
FIG. 5 shows details of the metrics calculator of the present invention for generating a simplified branch metric that requires fewer bits to represent, thereby decreasing the cost and power dissipate on, as well as increasing the channel's throughput.

The circuitry for implementing the branch metric calculators of the present invention (i.e., for implementing equation (8)) is shown in FIG. 5. In the preferred embodiment, the term $$(x_k^2+2A-rem(x_k^2,2A))/(2A) \quad (9)$$

of equation (8) is implemented using a lookup table 70 indexed by the read signal sample $x_k$ 44. The lookup table 70 is more efficient and faster than implementing the corresponding mathematical functions of equation (9). The output 72 of the lookup table 70 is added 74 to a constant $An^2/2$. The read signal sample $x_k$ 44 is multiplied 76 by n, and the result is subtracted 78 from the output of adder 74 to complete the simplified branch metric computation of equation (8). To further reduce the number of bits, the simplified branch metric 80 is saturated by saturation circuit 84, and the saturated branch metric 86 processed by the ACS circuits.

Figure 6A:
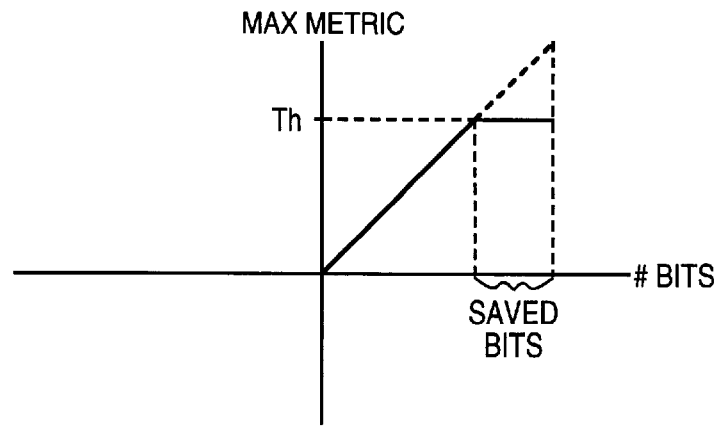
FIG. 6A illustrates how the present invention saturates the simplified branch metric in order to further reduce the number of bits required to represent the branch metrics.

FIG. 6A illustrates how saturating further reduces the number of bits needed to represent the simplified branch metrics $\hat{b}$. The vertical axis in FIG. 6A represents the maximum branch metric value and the horizontal axis represents the number of bits needed to represent the maximum value. In the present invention, the Viterbi algorithm is evaluated to determine a threshold Th where large branch metrics become insignificant. By saturating the large branch metrics to the threshold Th, the present invention reduces the number of bits needed to represent the branch metrics as well as the accumulated branch metrics, which in turn reduces the number of bits in the ACS circuitry.

Figure 6B:
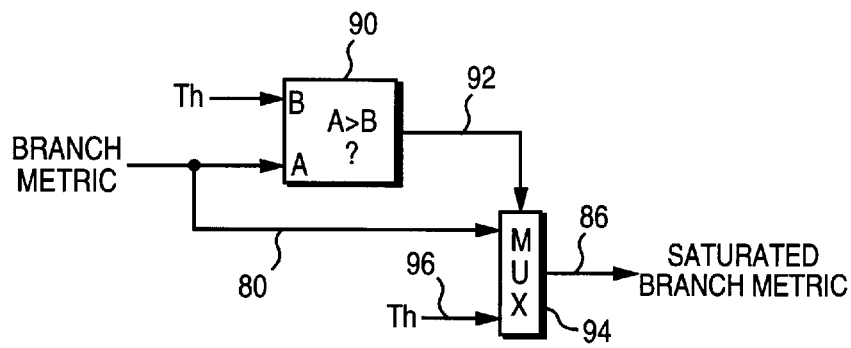
FIG. 6B shows details of the circuitry for implementing the saturation operation of FIG. 6A.
Figure 6C:
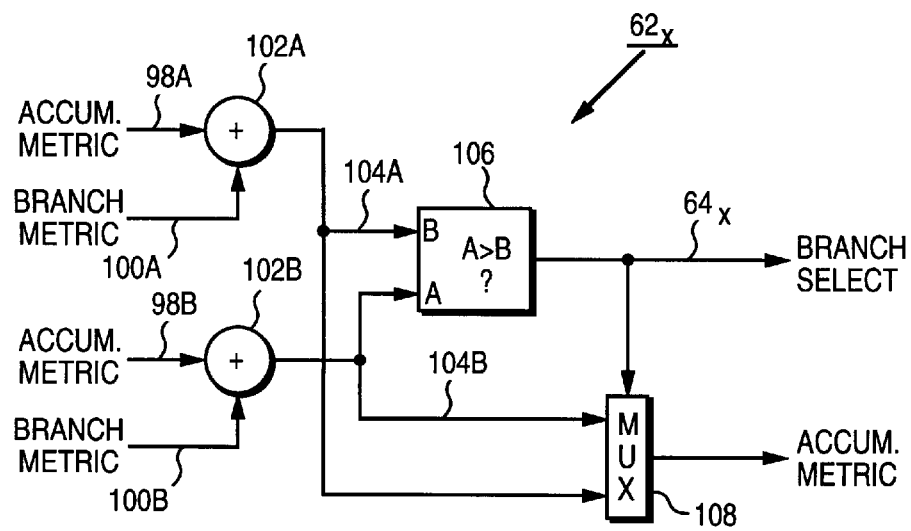
FIG. 6C shows details of the add-compare-select circuitry implemented for each state of the trellis sequence detector of FIG. 4.

The circuitry for implementing the saturation function of the present invention is shown in FIG. 6B. The simplified branch metric 80 generated by the metric calculator of FIG. 5 is compared to the saturation threshold Th of FIG. 6A at comparator 90. The output 92 of the comparator controls the operation of a multiplexer 94. If the simplified branch metric 80 exceeds the saturation threshold Th, then the comparator 90 selects the threshold Th as the saturated branch metric 86 output by the multiplexer 94. Otherwise, the comparator 90 selects the unmodified simplified branch metric 80 as the output 86 of the multiplexer 94. Details of an ACS circuit $62_x$ for use in the Viterbi sequence detector 50 of FIG. 4 are shown in FIG. 6C. Referring again to FIG. 2B, there are two branches leading to each state in the trellis (in a binary system) which correspond to two contending survivor sequences. Thus, the ACS circuit $62_x$ of FIG. 6C receives the accumulated branch metrics 98A and 98B corresponding to the two survivor sequences, as well as the branch metrics 100A and 100B corresponding to the new branches leading to the state. The new branch metrics 100A and 100B are added at adders 102A and 102B to the corresponding accumulated branch metrics 98A and 98B of the survivor sequences, and the resulting accumulated branch metrics 104A and 104B are compared at comparator 106. The comparator 106 generates a branch select control signal $64_x$ indicating which branch (the minimum branch metric) selected as a result of the comparison. The branch select control signal $64_x$ selects the minimum of the accumulated branch metrics 104A and 104B through multiplexer 108 which becomes the new accumulated branch metric for that state. The branch select control signal $64_x$ is also processed by the path memory controller 66 of FIG. 4 in order to merge the path memories of the survivor sequences not selected into the path memories of the survivor sequences that were selected, as illustrated in FIG. 2B.

The objects of the invention have been fully realized through the embodiments disclosed herein. Those skilled in the art will appreciate that the various aspects of the invention can be achieved through different embodiments without departing from the essential function. For instance, the PR4 trellis sequence detector shown in FIG. 4 merely provides a contextual example of the present invention; however, the simplified branch metric calculator of the present invention is actually intended for use in higher order partial response read channels (e.g., EPR4, EEPR4, etc.) where branch metric calculators and ACS circuits are necessary to implement the Viterbi algorithm. Thus, the particular embodiments disclosed are illustrative and not meant to limit the scope of the invention as appropriately construed from the following claims.

What is claimed is:

1. A sampled amplitude read channel for reading data recorded on a disk storage medium by detecting an estimated binary sequence from a sequence of discrete-time sample values generated by sampling an analog read signal emanating from a read head positioned over the disk storage medium, the sampled amplitude read channel comprising:

(a) a sampling device for sampling the analog read signal to generate the discrete-time sample values;

(b) a timing recovery circuit, responsive to the discrete-time sample values, for generating synchronous sample values $x_k$; and (c) a trellis sequence detector for detecting the estimated binary sequence from the synchronous sample values $x_k$, the trellis sequence detector comprising a branch metric calculator for calculating a simplified branch metric by effectively adding a positive offset to a Euclidean branch metric to make it a multiple of a scaler and dividing by the scaler, thereby reducing a number of bits used to represent the simplified branch metric.

2. The sampled amplitude read channel as recited in claim 1, wherein the simplified branch metric is calculated proportional to $$((x_k^2+2A-\text{rem}(x_k^2,2A))/2A)-nx_k+An^2/2$$

where A is an even positive integer, n is an integer, An represents an ideal sample value of a target partial response, and the function rem(a,b) returns the remainder of a/b.

3. The sampled amplitude read channel as recited in claim 2, further comprising a look-up table, indexed by $x_k$, for generating the component $$((x_k^2+2A-\text{rem}(x_k^2,2A))/2A)$$

of the simplified branch metric.

4. The sampled amplitude read channel as recited in claim 1, wherein the branch calculator further comprises a saturation circuit for saturating the simplified branch metric in order to further reduce the number of bits used to represent the simplified branch metric.

5. The sampled amplitude read channel as recited in claim 4, wherein the saturation circuit adjusts the simplified branch metric when the simplified branch metric exceeds a predetermined threshold.

6. A sampled amplitude read channel for reading data recorded on a disk storage medium by detecting an estimated binary sequence from a sequence of discrete-time sample values generated by sampling an analog read signal emanating from a read head positioned over the disk storage medium, the sampled amplitude read channel comprising:

(a) a sampling device for sampling the analog read signal to generate the discrete-time sample values;

(b) a timing recovery circuit, responsive to the discrete-time sample values, for generating synchronous sample values $x_k$; and (c) a trellis sequence detector for detecting the estimated binary sequence from the synchronous sample values $x_k$, the trellis sequence detector comprising a branch metric calculator for calculating a simplified branch metric calculated proportional to $$((x_k^2+2A-\text{rem}(x_k^2,2A))/2A)-nx_k+An^2/2$$

where A is an even positive integer, n is an integer, An represents an ideal sample value of a target partial response, and the function rem(a,b) returns the remainder of a/b.

7. The sampled amplitude read channel as recited in claim 6, further comprising a look-up table, indexed by $x_k$, for generating the component $$((x_k^2+2A-\text{rem}(x_k^2,2A))/2A)$$

of the simplified branch metric.

8. The sampled amplitude read channel as recited in claim 6, wherein the branch calculator further comprises a saturation circuit for saturating the simplified branch metric in order to reduce a number of bits used to represent the simplified branch metric.

9. The sampled amplitude read channel as recited in claim 8, wherein the saturation circuit adjusts the simplified branch metric when the simplified branch metric exceeds a predetermined threshold.

10. A method reading data recorded on a disk storage medium by detecting an estimated binary sequence from a sequence of discrete-time sample values generated by sampling an analog read signal emanating from a read head positioned over the disk storage medium, comprising the steps of:

(a) sampling the analog read signal to generate the discrete-time sample values;

(b) extracting synchronous sample values $x_k$ from the discrete-time sample values; and (c) detecting the estimated binary sequence from the synchronous sample values $x_k$ by calculating a simplified branch metric of a trellis by effectively adding a positive offset to a Euclidean branch metric to make it a multiple of a scaler and dividing by the scaler, thereby reducing a number of bits used to represent the simplified branch metric.

11. The method of reading data recorded on a disk storage medium as recited in claim 10, wherein the simplified branch metric is calculated proportional to $$((x_k^2+2A-\text{rem}(x_k^2,2A))/2A)-nx_k+An^2/2$$

where A is an even positive integer, n is an integer, An represents an ideal sample value of a target partial response, and the function rem(a,b) returns the remainder of a/b.

12. The method of reading data recorded on a disk storage medium as recited in claim 11, wherein the step of detecting the estimated binary sequence further comprises the step of indexing a lookup table by $x_k$ to generate the component $$((x_k^2+2A-\text{rem}(x_k^2,2A))/2A)$$

of the simplified branch metric.

13. The method of reading data recorded on a disk storage medium as recited in claim 10, wherein the step of detecting the estimated binary sequence further comprises the step of saturating the simplified branch metric in order to further reduce the number of bits used to represent the simplified branch metric.

14. The method of reading data recorded on a disk storage medium as recited in claim 13, wherein the step of saturating comprises the step of adjusting the simplified branch metric when the simplified branch metric exceeds a predetermined threshold.

* * * * *